(12) United States Patent
Kitahara

(10) Patent No.: US 8,461,025 B2
(45) Date of Patent: Jun. 11, 2013

(54) PROTECTIVE FILM FORMING METHOD AND APPARATUS

(75) Inventor: Nobuyasu Kitahara, Ota-Ku (JP)

(73) Assignee: Disco Corporation, Tokyo (JP)

( * ) Notice: Subject to any disclaimer, the term of this patent is extended or adjusted under 35 U.S.C. 154(b) by 259 days.

(21) Appl. No.: 12/873,407

(22) Filed: Sep. 1, 2010

(65) Prior Publication Data
US 2011/0059620 A1  Mar. 10, 2011

(30) Foreign Application Priority Data
Sep. 7, 2009  (JP) .................... 2009-205980

(51) Int. Cl.
*H01L 21/00* (2006.01)
*H01L 21/31* (2006.01)
*H01L 21/469* (2006.01)

(52) U.S. Cl.
USPC .......................................... 438/465; 438/782

(58) Field of Classification Search
USPC ............. 438/460, 782, 462, 463, 464; 118/52
See application file for complete search history.

(56) References Cited

U.S. PATENT DOCUMENTS

| | | | |
|---|---|---|---|
| 2001/0050041 A1 * | 12/2001 | Reardon et al. | 118/52 |
| 2006/0105544 A1 * | 5/2006 | Takanashi et al. | 438/460 |
| 2006/0216911 A1 * | 9/2006 | Yoshikawa et al. | 438/460 |
| 2008/0190361 A1 * | 8/2008 | DeMuynck et al. | 118/313 |

FOREIGN PATENT DOCUMENTS

| | | |
|---|---|---|
| JP | 10-305420 | 11/1998 |
| JP | 2007-201178 | 8/2007 |

* cited by examiner

*Primary Examiner* — William D Coleman
*Assistant Examiner* — Wilner Jean Baptiste
(74) *Attorney, Agent, or Firm* — Greer, Burns & Crain, Ltd.

(57) ABSTRACT

A protective film forming method for forming a protective film of resin on the front side of a wafer, where the method includes a step of holding the wafer on a spinner table in the condition where the front side of said wafer is oriented upward; a step of forming a water layer of a thickness of between about 1 mm and about 3 mm to cover the front side of the wafer; a step of dropping a liquid resin onto the water layer at the center of the wafer; and a step of rotating the spinner table to rotate the wafer held on the spinner table, thereby scattering the water layer and radially spreading the liquid resin dropped on the water layer to form a first resin film covering the front side of the wafer by a centrifugal force produced during rotation of the wafer.

3 Claims, 13 Drawing Sheets

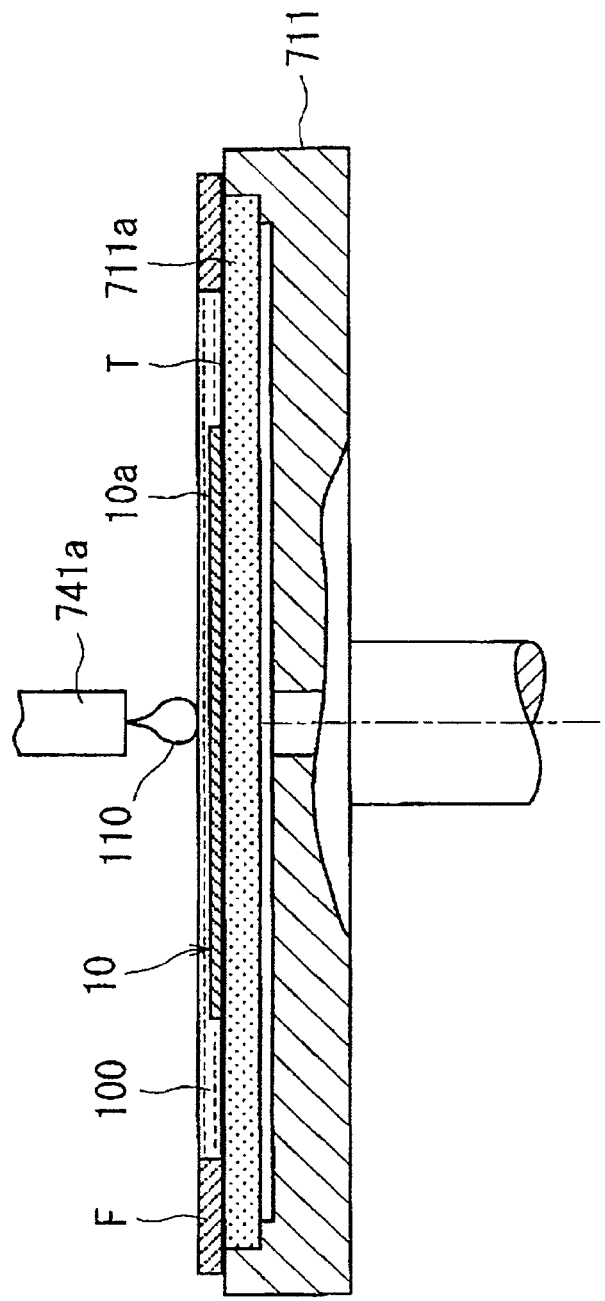

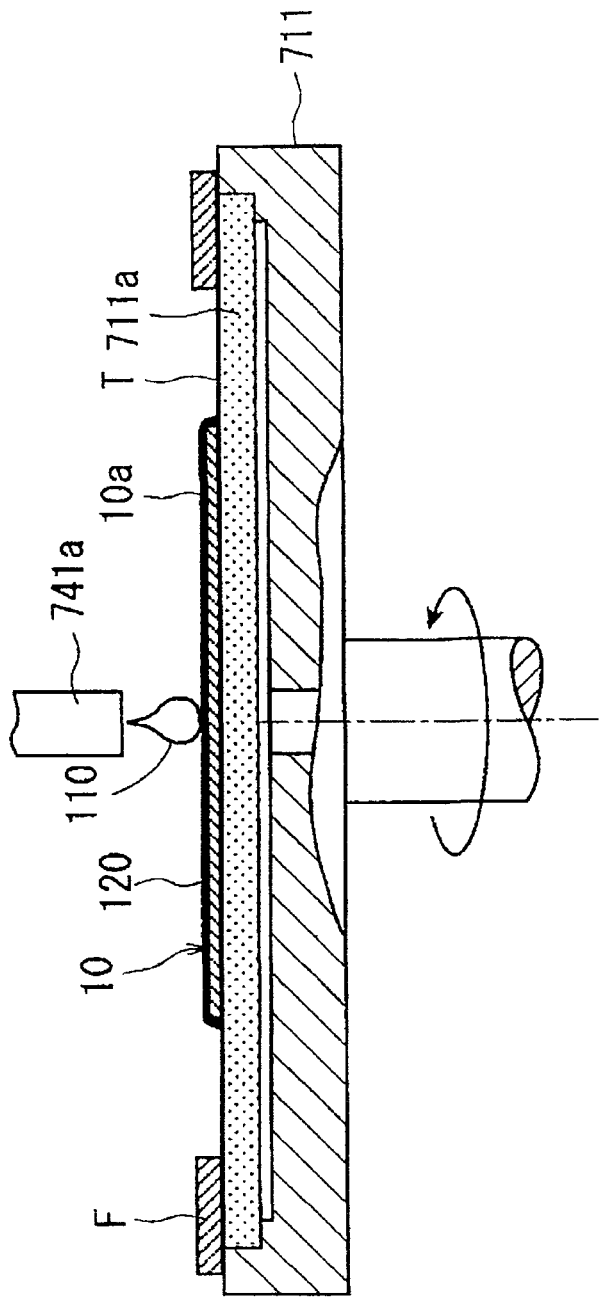

PROTECTIVE FILM FORMING METHOD AND APPARATUS

BACKGROUND OF THE INVENTION

1. Field of the Invention

The present invention relates to a protective film forming method and apparatus for forming a protective film on a work surface of a workpiece such as a semiconductor wafer.

2. Description of the Related Art

As well known in the art, a semiconductor wafer having a plurality of devices such as ICs and LSIs arranged in a matrix on the front side of a semiconductor substrate such as a silicon substrate is fabricated in a semiconductor device fabrication process, wherein each device is formed as a laminate of an insulating film and a functional film. In such a semiconductor wafer, the devices are partitioned from each other by a plurality of division lines called streets preliminarily formed on the semiconductor substrate, and the semiconductor wafer is cut along these streets to produce the individual devices. Further, in an optical device wafer, the front side of a sapphire substrate or the like is partitioned into a plurality of regions by a plurality of crossing streets, and a gallium nitride compound semiconductor or the like is layered in each of these partitioned regions of the substrate to thereby form an optical device. Such an optical device wafer is divided along the streets into a plurality of optical devices such as light emitting diodes and laser diodes, which are widely used for electrical equipment.

As a method of dividing a wafer such as a semiconductor wafer and an optical device wafer along the streets formed on the front side of the wafer, there has been proposed a method including the steps of applying a pulsed laser beam to the wafer along the streets to thereby form a plurality of laser processed grooves and next breaking the wafer along these laser processed grooves by using a mechanical breaking apparatus (see Japanese Patent Laid-open No. Hei 10-305420, for example).

Such laser processing has advantages over cutting such that a processing speed is higher and a wafer formed of a hard material such as sapphire can be processed relatively easily. However, when a laser beam is applied to the wafer along the streets, thermal energy is concentrated at a region irradiated with the laser beam, causing the generation of debris, and this debris may stick to the surface of the devices formed on the wafer, causing a degradation in quality of the devices.

To solve this problem due to the debris, there has been proposed a laser processing system including a protective film forming apparatus for forming a protective film of resin such as polyvinyl alcohol on the front side of a wafer, wherein a laser beam is applied through the protective film to the wafer. The protective film forming apparatus included in this laser processing system has a spinner table for holding the wafer thereon under suction, wherein a liquid resin such as polyvinyl alcohol is supplied to the center of the wafer as rotating the spinner table holding the wafer, thus performing spin coating of the liquid resin (see Japanese Patent Laid-open No. 2007-201178, for example).

SUMMARY OF THE INVENTION

In the case of forming a protective film having a thickness of 4 μm on the front side of a wafer having a diameter of 300 mm, for example, by using the above-mentioned spin coating method, the amount of use of the liquid resin such as polyvinyl alcohol is 19 to 30 cc. However, the actual amount of the liquid resin forming the protective film on the front side of the wafer is 0.3 cc, and 98 to 99% of the liquid resin supplied is wasted, thus resulting in poor economic efficiency.

It is therefore an object of the present invention to provide a protective film forming method and apparatus which can form a protective film having a uniform thickness from a liquid resin on the front side of a wafer with the amount of usage of the liquid resin being reduced.

In accordance with an aspect of the present invention, there is provided a protective film forming method for forming a protective film of resin on the front side of a wafer to be laser-processed, including a wafer holding step of holding the wafer on a spinner table in the condition where the front side of the wafer is oriented upward; a water layer forming step of forming a water layer covering the front side of the wafer held on the spinner table; a first liquid resin dropping step of dropping a liquid resin onto the water layer at the center of the wafer; a first resin film forming step of rotating the spinner table to rotate the wafer held on the spinner table, thereby scattering the water layer and radially spreading the liquid resin dropped on the water layer to form a first resin film covering the front side of the wafer by a centrifugal force produced during rotation of the wafer; a second liquid resin dropping step of dropping the liquid resin onto the first resin film at the center of the wafer; and a second resin film forming step of rotating the spinner table to rotate the wafer held on the spinner table, thereby radially spreading the liquid resin dropped on the first resin film to form a second resin film covering the first resin film by a centrifugal force produced during rotation of the wafer.

Preferably, the back side of the wafer is attached to an adhesive tape supported to an annular frame; and the water layer forming step includes the step of filling the area defined by the inner circumferential surface of the annular frame and the adhesive tape with water, thereby forming a water layer covering the front side of the wafer.

In accordance with another aspect of the present invention, there is provided a protective film forming apparatus for forming a protective film of resin on the front side of a wafer, including a spinner table for holding the wafer thereon in the condition where the back side of the wafer is attached to an adhesive tape supported to an annular frame; rotationally driving means for rotationally driving the spinner table; a water supplying mechanism for supplying water to the wafer supported through the adhesive tape to the annular frame held on the spinner table; a liquid resin supplying mechanism for supplying a liquid resin to the wafer supported through the adhesive tape to the annular frame held on the spinner table; and control means for controlling the rotationally driving means, the water supplying mechanism, and the liquid resin supplying mechanism; the control means performing a water layer forming step of operating the water supplying mechanism to supply the water to the wafer supported through the adhesive tape to the annular frame held on the spinner table, thereby forming a water layer covering the front side of the wafer; a first liquid resin dropping step of operating the liquid resin supplying mechanism after performing the water layer forming step to drop the liquid resin onto the water layer at the center of the wafer; a first resin film forming step of operating the rotationally driving means after performing the first liquid resin dropping step to rotate the spinner table holding the wafer, thereby scattering the water layer and radially spreading the liquid resin dropped on the water layer to form a first resin film covering the front side of the wafer by a centrifugal force produced during rotation of the wafer; a second liquid resin dropping step of operating the liquid resin supplying mechanism after performing the first resin forming step to drop the liquid resin onto the first resin film at the center of the wafer; and a second resin film forming step of operating the rotationally driving means after performing the second liquid resin dropping step to rotate the spinner table holding the wafer, thereby radially spreading the liquid resin dropped on the first resin film to form a second resin film covering the first resin film by a centrifugal force produced during rotation of the wafer.

According to the protective film forming method of the present invention, the water layer is formed so as to fully cover the front side of the wafer held on the spinner table. Thereafter, the liquid resin is dropped onto the water layer at the center of the wafer, and the spinner table is next rotated to scatter the water layer and radially spread the liquid resin dropped on the water layer owing to the centrifugal force produced during rotation of the wafer, thereby forming the first resin film. Accordingly, the first resin film having a uniform thickness can be formed entirely on the front side of the wafer. Thereafter, the liquid resin is dropped onto the first resin film at the center of the wafer, and the spinner table is next rotated to radially spread the liquid resin dropped on the first resin film owing to the centrifugal force produced during rotation of the wafer, thereby forming the second resin film. Accordingly, the liquid resin is radially spread on the first resin film having good affinity to the liquid resin, so that the second resin film having a uniform thickness can be formed entirely on the first resin film with a small amount of liquid resin.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 8 is a sectional side view for illustrating a first liquid resin dropping step in the protective film forming method according to the present invention;

FIG. 10 is a sectional side view for illustrating a second liquid resin dropping step in the protective film forming method according to the present invention;

DETAILED DESCRIPTION OF THE PREFERRED EMBODIMENTS

Figure 1:
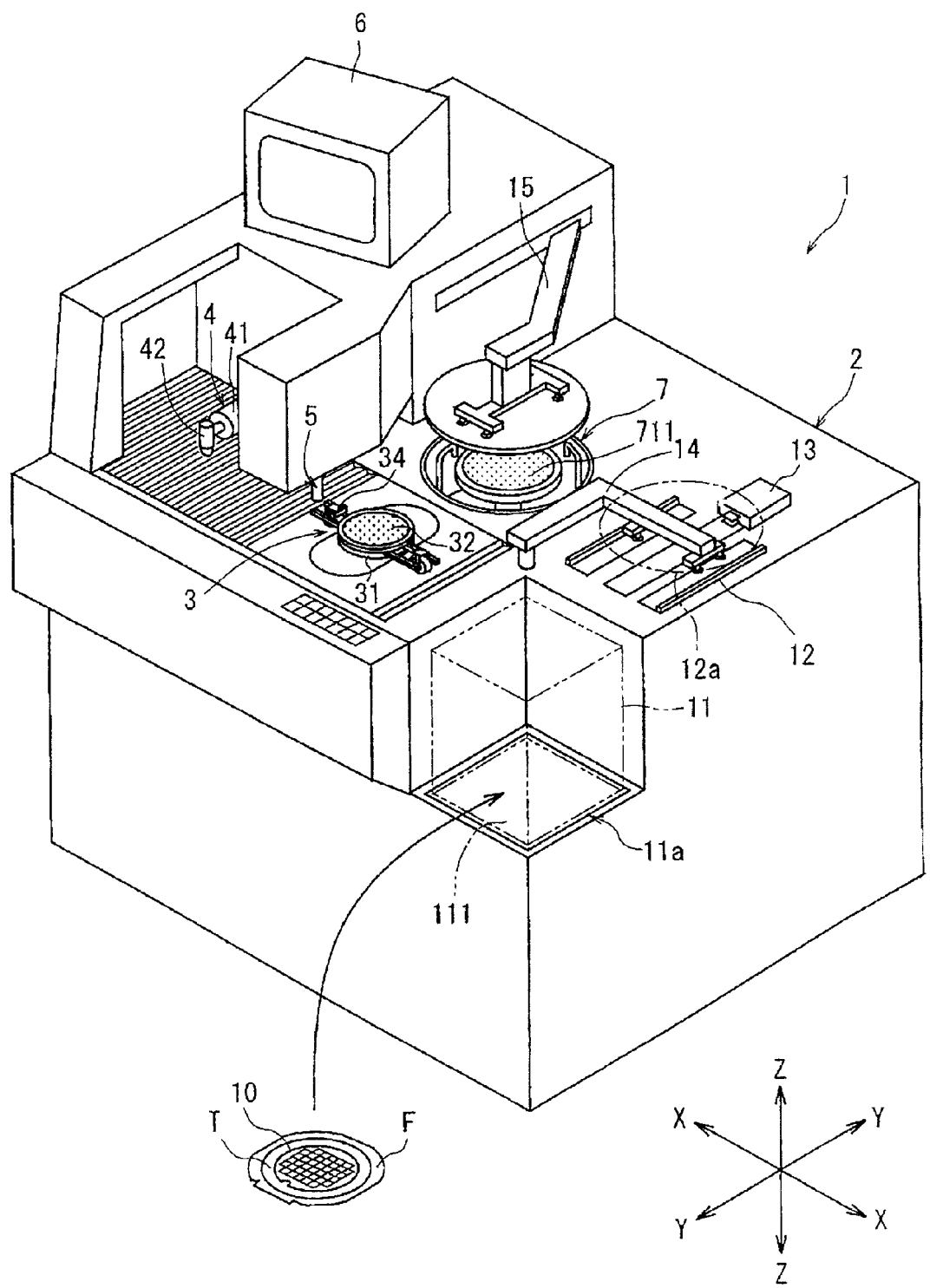
FIG. 1 is a perspective view of a laser processing system including a protective film forming apparatus serving also as cleaning means according to a preferred embodiment of the present invention.

A preferred embodiment of the protective film forming method and apparatus according to the present invention will now be described in detail with reference to the attached drawings. Referring to FIG. 1, there is shown a perspective view of a laser processing system 1 including the protective film forming apparatus according to the present invention. The laser processing system 1 shown in FIG. 1 has a substantially boxlike housing 2. The housing 2 contains a chuck table 3 for holding a wafer as a workpiece. The chuck table 3 is movable both in the direction shown by an arrow X as a feeding direction and in the direction shown by an arrow Y perpendicular to the arrow X as an indexing direction. The chuck table 3 has a vacuum chuck support 31 and a vacuum chuck 32 mounted on the vacuum chuck support 31. The vacuum chuck 32 has an upper surface as a holding surface for holding the wafer thereon under suction by operating suction means (not shown). Further, the chuck table 3 is rotatable by a rotating mechanism (not shown). The vacuum chuck support 31 of the chuck table 3 is provided with a pair of clamps 34 for fixing an annular frame for a disk-shaped semiconductor wafer to be hereinafter described. Although not shown, the laser processing system 1 includes feeding means for feeding the chuck table 3 in the feeding direction X and indexing means for indexing the chuck table 3 in the indexing direction Y.

The laser processing system 1 includes laser beam applying means 4 for applying a laser beam to the wafer held on the chuck table 3 to process the wafer. The laser beam applying means 4 includes laser beam oscillating means 41 for oscillating a laser beam and focusing means 42 for focusing the laser beam oscillated by the laser beam oscillating means 41. Although not shown, the laser processing system 1 includes moving means for moving the laser beam oscillating means 41 in the direction shown by an arrow Z perpendicular to the holding surface of the vacuum chuck 32 of the chuck table 3 as a focal position adjusting direction.

The laser processing system 1 further includes imaging means 5 for imaging the upper surface of the workpiece held on the vacuum chuck 32 of the chuck table 3 to detect a region to be processed by the laser beam applied from the focusing means 42 of the laser beam applying means 4. The imaging means 5 includes an ordinary imaging device (CCD) for imaging the workpiece by using visible light, infrared light applying means for applying infrared light to the workpiece, an optical system for capturing the infrared light applied by the infrared light applying means, and an imaging device (infrared CCD) for outputting an electrical signal corresponding to the infrared light captured by the optical system. An image signal output from the imaging means 5 is transmitted to control means (not shown). The laser processing system 1 further includes displaying means 6 for displaying the image obtained by the imaging means 5.

Figure 2:
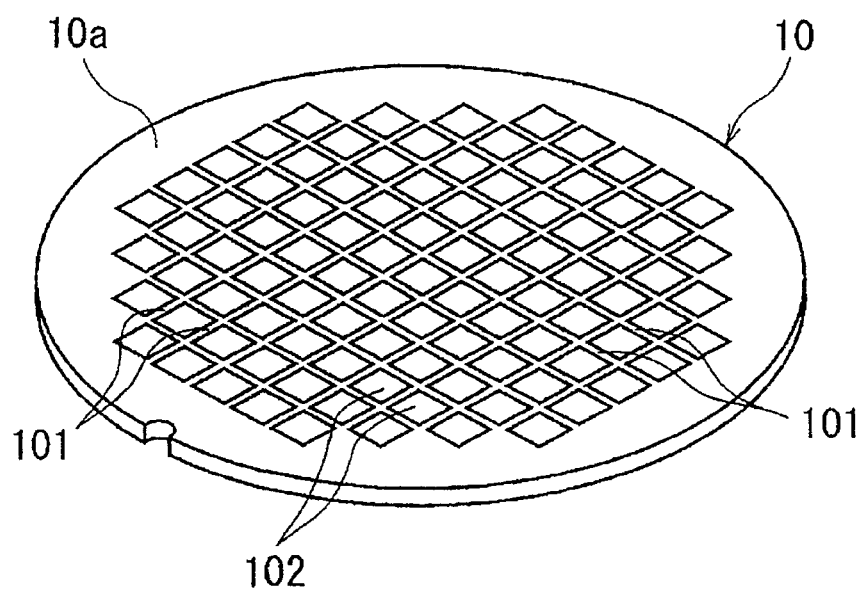
FIG. 2 is a perspective view of a semiconductor wafer as a wafer to be laser-processed.

The laser processing system 1 further includes a cassette setting portion 11a for setting a cassette 11 storing a semiconductor wafer 10 as a wafer to be laser-processed. The cassette setting portion 11a is provided with a cassette table 111 vertically movable by lifting means (not shown). The cassette 11 is set on the cassette table 111. The semiconductor wafer 10 is attached to the upper surface (adhesive surface) of an adhesive tape T supported to an annular frame F. Thus, the semiconductor wafer 10 supported through the adhesive tape T to the annular frame F is stored in the cassette 11. As shown in FIG. 2, the semiconductor wafer 10 has a front side 10a and a back side. The front side 10a of the semiconductor wafer 10 is partitioned into a plurality of rectangular regions by a plurality of crossing division lines (streets) 101, wherein a plurality of individual devices 102 such as ICs and LSIs are respectively formed in these plural rectangular regions. The back side of the semiconductor wafer 10 is attached to the upper surface (adhesive surface) of the adhesive tape T supported to the annular frame F in the condition where the front side 10a (work surface) of the semiconductor wafer 10 is oriented upward as shown in FIG. 1.

The laser processing system 1 further includes positioning means 12 provided at a temporary setting portion 12a for temporarily setting the semiconductor wafer 10, wafer ejecting/inserting means 13 for ejecting the semiconductor wafer 10 from the cassette 11 before processing and inserting the semiconductor wafer 10 into the cassette 11 after processing, a protective film forming apparatus 7 serving also as cleaning means for forming a protective film on the front side 10a (the work surface) of the semiconductor wafer 10 before processing and for cleaning off the protective film from the semiconductor wafer 10 after processing, first carrying means 14 for carrying the semiconductor wafer 10 from the positioning means 12 to the protective film forming apparatus 7 before processing and for carrying the semiconductor wafer 10 from the protective film forming apparatus 7 serving also as cleaning means to the positioning means 12 after processing, and second carrying means 15 for carrying the semiconductor wafer 10 from the protective film forming apparatus 7 to the chuck table 3 before processing and for carrying the semiconductor wafer 10 from the chuck table 3 to the protective film forming apparatus 7 serving also as cleaning means after processing.

Figure 3:
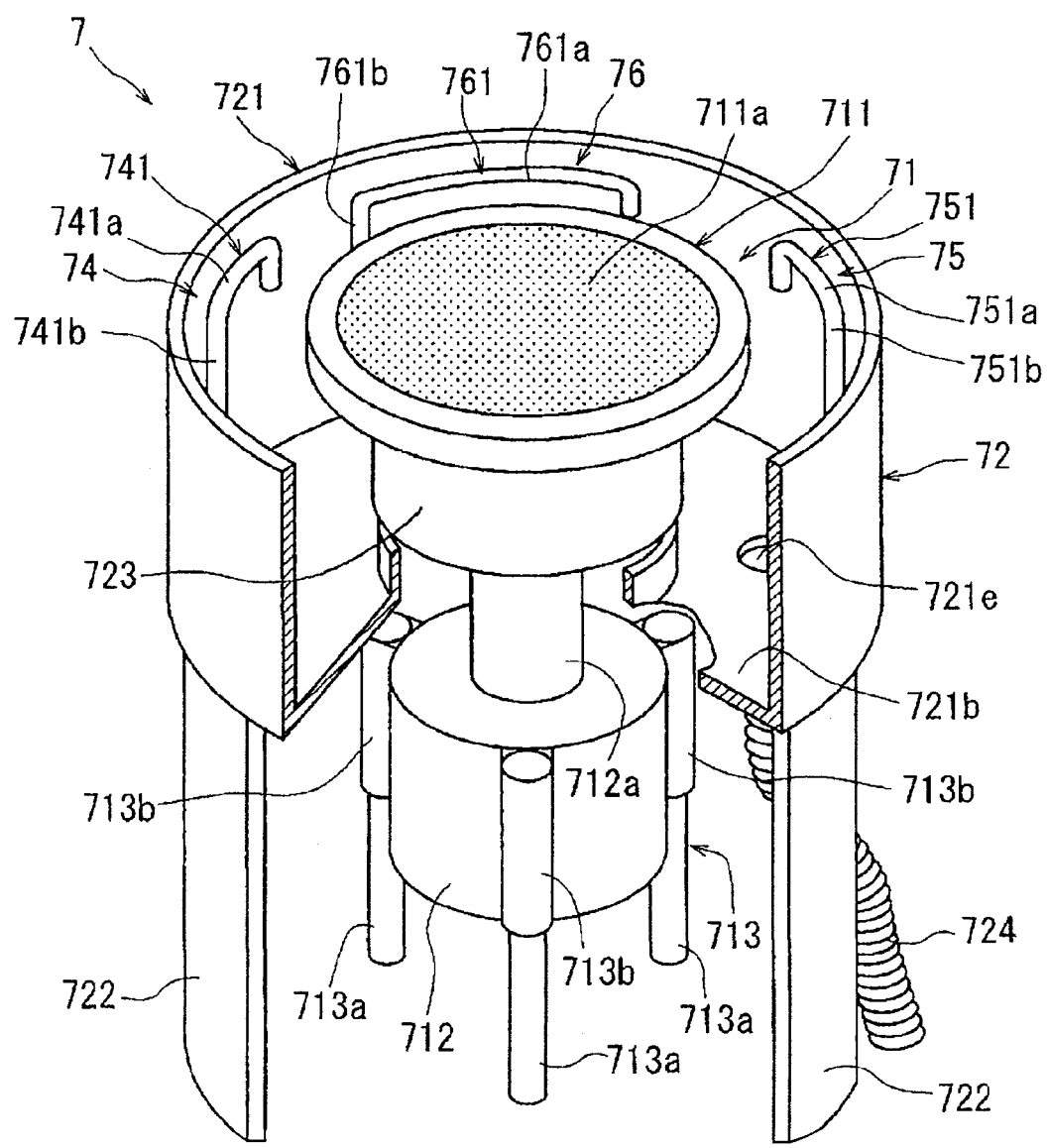
FIG. 3 is a partially cutaway perspective view of the protective film forming apparatus serving also as cleaning means included in the laser processing system shown in FIG. 1.

The protective film forming apparatus 7 serving also as cleaning means will now be described with reference to FIGS. 3 to 5.

The protective film forming apparatus 7 includes a spinner table mechanism 71 and spinner table accommodating means 72 provided so as to surround the spinner table mechanism 71. The spinner table mechanism 71 includes a spinner table 711, an electric motor 712 as rotationally driving means for rotationally driving the spinner table 711, and supporting means 713 for vertically movably supporting the electric motor 712. The spinner table 711 includes a vacuum chuck 711a formed of a porous material. The vacuum chuck 711a is connected to suction means (not shown). Accordingly, the spinner table 711 functions to hold the semiconductor wafer 10 as a workpiece placed on the vacuum chuck 711a by using a vacuum produced by the suction means. The electric motor 712 has a drive shaft 712a, and the spinner table 711 is connected to the upper end of the drive shaft 712a. The supporting means 713 is composed of a plurality of (three in this preferred embodiment) support legs 713a and a plurality of (three in this preferred embodiment) air cylinders 713b operatively connected to the support legs 713a, respectively. All of the air cylinders 713b are mounted on the electric motor 712. The supporting means 713 functions in such a manner that the air cylinders 713b are operated to vertically move the electric motor 712 and the spinner table 711 between the upper position shown in FIG. 4 as a work load/unload position and the lower position shown in FIG. 5 as a working position.

The spinner table accommodating means 72 includes a receptacle 721, three support legs 722 for supporting the receptacle 721 (two of the three support legs 722 being shown in FIG. 3), and a cover member 723 mounted on the drive shaft 712a of the electric motor 712. As shown in FIGS. 4 and 5, the receptacle 721 is composed of a cylindrical outer wall 721a, a bottom wall 721b, and a cylindrical inner wall 721c. The bottom wall 721b is formed at its central portion with a central hole 721d for allowing the insertion of the drive shaft 712a of the electric motor 712. The cylindrical inner wall 721c projects upward from the peripheral edge of the central hole 721d. As shown in FIG. 3, the bottom wall 721b is formed with a waste fluid outlet 721e, and a drain hose 724 is connected to the waste fluid outlet 721e. The cover member 723 is a cylindrical member having a closed top. The closed top of the cover member 723 is mounted to the upper end portion of the drive shaft 712a of the electric motor 712, and a covering portion 723a projects downward from the outer circumference of the closed top of the cover member 723. In the working position of the electric motor 712 and the spinner table 711 as shown in FIG. 5, the covering portion 723a of the cover member 723 is located so as to surround the cylindrical inner wall 721c of the receptacle 721 with a given gap defined therebetween.

The protective film forming apparatus 7 further includes a liquid resin supplying mechanism 74 for supplying a liquid resin to the front side 10a (work surface) of the semiconductor wafer 10 as a workpiece held on the spinner table 711 before processing. The liquid resin supplying mechanism 74 includes a liquid resin nozzle 741 for supplying the liquid resin toward the front side 10a (work surface) of the semiconductor wafer 10 held on the spinner table 711 before processing and a reversible electric motor 742 (see FIGS. 4 and 5) for horizontally swinging the liquid resin nozzle 741. As shown in FIGS. 4 and 5, the liquid resin nozzle 741 is connected to liquid resin supplying means 740. The liquid resin nozzle 741 is composed of a horizontally extending nozzle portion 741a having a downward bent front end (discharge opening) and a support portion 741b extending downward from the base end of the nozzle portion 741a. The support portion 741b is inserted through a hole (not shown) formed through the bottom wall 721b of the receptacle 721 and is connected to the liquid resin supplying means 740 (see FIGS. 4 and 5). Although not shown, a seal member is mounted to the peripheral edge of the insert hole of the bottom wall 721b for allowing the insertion of the support portion 741b of the liquid resin nozzle 741, thereby sealing the gap between the support portion 741b and the bottom wall 721b.

The protective film forming apparatus 7 further includes a water supplying mechanism 75 for supplying water to the semiconductor wafer 10 held on the spinner table 711. The water supplying mechanism 75 includes a water nozzle 751 for supplying the water toward the front side 10a of the semiconductor wafer 10 held on the spinner table 711 and a reversible electric motor 752 (see FIGS. 4 and 5) for horizontally swinging the water nozzle 751. As shown in FIGS. 4 and 5, the water nozzle 751 is connected to water supplying means 750. The water nozzle 751 is composed of a horizontally extending nozzle portion 751a having a downward bent front end (discharge opening) and a support portion 751b extending downward from the base end of the nozzle portion 751a. The support portion 751b is inserted through a hole (not shown) formed through the bottom wall 721b of the receptacle 721 and is connected to the water supplying means 750 (see FIGS. 4 and 5). Although not shown, a seal member is mounted to the peripheral edge of the insert hole of the bottom wall 721b for allowing the insertion of the support portion 751b of the water nozzle 751, thereby sealing the gap between the support portion 751b and the bottom wall 721b.

The protective film forming apparatus 7 further includes an air supplying mechanism 76 for supplying air to the semiconductor wafer 10 held on the spinner table 711. The air supplying mechanism 76 includes an air nozzle 761 for supplying the air toward the front side 10a of the semiconductor wafer 10 held on the spinner table 711 and a reversible electric motor 762 (see FIGS. 4 and 5) for horizontally swinging the air nozzle 761. As shown in FIGS. 4 and 5, the air nozzle 761 is connected to air supplying means 760. The air nozzle 761 is composed of a horizontally extending nozzle portion 761a having a downward bent front end (discharge opening) and a support portion 761b extending downward from the base end of the nozzle portion 761a. The support portion 761b is inserted through a hole (not shown) formed through the bottom wall 721b of the receptacle 721 and is connected to the air supplying means 760 (see FIGS. 4 and 5). Although not shown, a seal member is mounted to the peripheral edge of the insert hole of the bottom wall 721b for allowing the insertion of the support portion 761b of the air nozzle 761, thereby sealing the gap between the support portion 761b and the bottom wall 721b.

Figure 6:
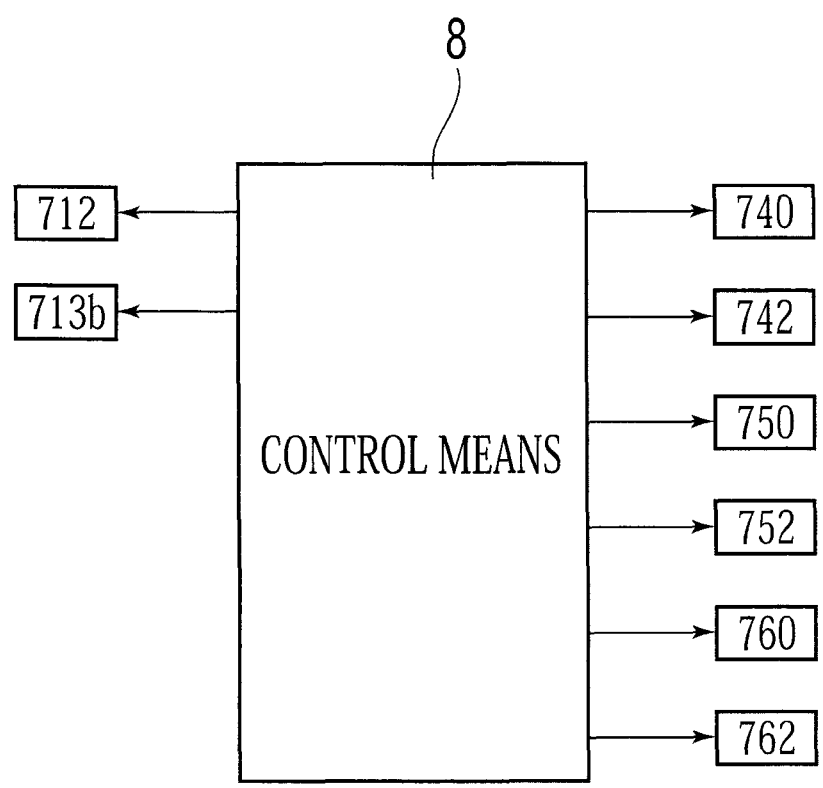
FIG. 6 is a block diagram of control means for controlling the protective film forming apparatus serving also as cleaning means shown in FIG. 3.

The protective film forming apparatus 7 further includes control means 8 shown in FIG. 6. The control means 8 controls the electric motor 712 and the air cylinders 713b of the spinner table mechanism 71, the liquid resin supplying means 740 and the electric motor 742 of the liquid resin supplying mechanism 74, the water supplying means 750 and the electric motor 752 of the water supplying mechanism 75, and the air supplying means 760 and the electric motor 762 of the air supplying mechanism 76. The control means 8 may be used as the control means (not shown) for controlling the operation of the laser processing system 1.

The operation of the laser processing system 1 including the protective film forming apparatus 7 serving also as cleaning means will now be described. The semiconductor wafer 10 supported through the adhesive tape T to the annular frame F as shown in FIG. 1 (which will be hereinafter referred to simply as the semiconductor wafer 10) is stored at a predetermined position in the cassette 11 in the condition where the front side 10a (work surface) of the semiconductor wafer 10 is oriented upward. The cassette table 111 is next lifted or lowered by the lifting means to thereby move the semiconductor wafer 10 stored in the cassette 11 to an ejecting position where the semiconductor wafer 10 is ejected from the cassette 11. The work ejecting/inserting means 13 is next operated to eject the semiconductor wafer 10 from the cassette 11 and to move the semiconductor wafer 10 from the ejecting position to the positioning means 12 provided at the temporary setting portion 12a. The semiconductor wafer 10 moved to the positioning means 12 is set to a predetermined position in the temporary setting portion 12a by the positioning means 12. The semiconductor wafer 10 thus positioned by the positioning means 12 is next carried onto the vacuum chuck 711a of the spinner table 711 of the protective film forming apparatus 7 by the swiveling operation of the first carrying means 14. The semiconductor wafer 10 placed on the vacuum chuck 711a is held under suction on the vacuum chuck 711a by the suction means (wafer holding step). At this time, the spinner table 711 is set at the load/unload position shown in FIG. 4, and all of the liquid resin nozzle 741, the water nozzle 751, and the air nozzle 761 are set at their standby positions where they are retracted from the spinner table 711 as shown in FIGS. 3 and 4.

Figure 7:
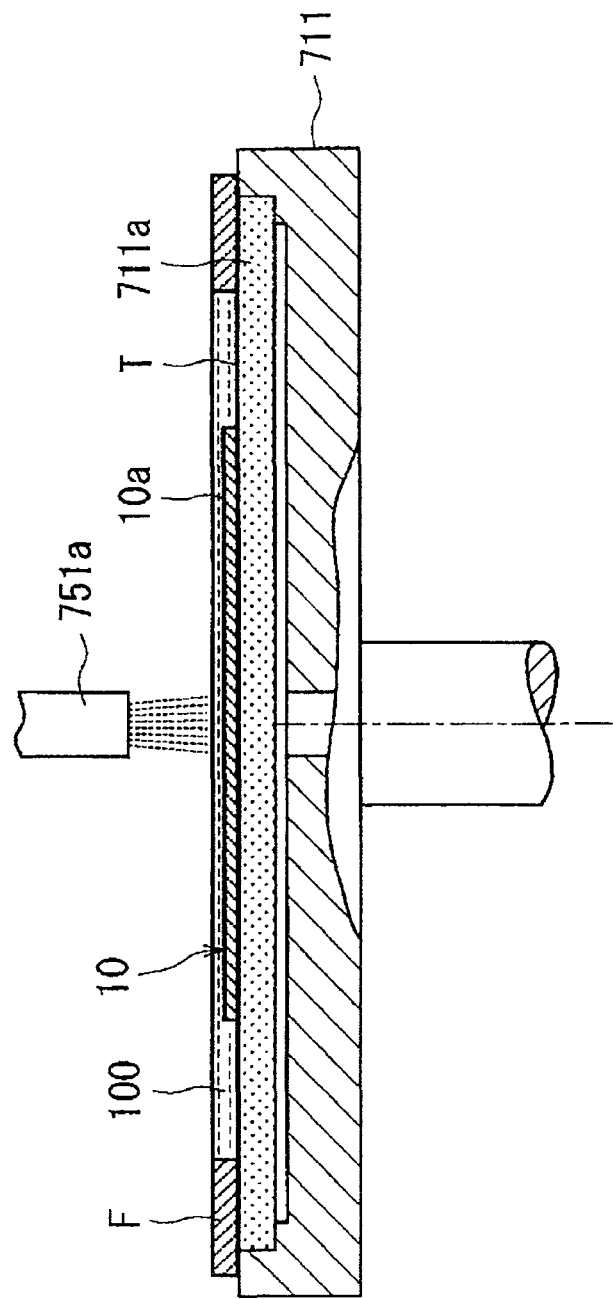
FIG. 7 is a sectional side view for illustrating a water layer forming step in the protective film forming method according to the present invention.

After performing the above-mentioned wafer holding step to hold the semiconductor wafer 10 on the spinner table 711 of the protective film forming apparatus 7, a protective film forming step is performed to form a protective film on the front side 10a (work surface) of the semiconductor wafer 10. More specifically, a water layer forming step is first performed to form a water layer covering the front side 10a of the semiconductor wafer 10 held on the spinner table 711. The water layer forming step is performed in the following manner. The control means 8 operates the air cylinders 713b of the supporting means 713 to lower the spinner table 711 to the working position, and also operates the electric motor 752 of the water supplying mechanism 75 to swivel the nozzle portion 751a of the water nozzle 751 about the axis of the support portion 751b so that the front end of the nozzle portion 751a comes to a position directly above the center of the front side 10a of the semiconductor wafer 10 held on the spinner table 711 as shown in FIG. 7. The control means 8 next operates the water supplying means 750 to supply water from the nozzle portion 751a of the water nozzle 751 onto the front side 10a of the semiconductor wafer 10. When the level of the water supplied reaches the upper surface of the annular frame F supporting the semiconductor wafer 10 through the adhesive tape T, the area defined by the inner circumferential surface of the annular frame F and the adhesive tape T is filled with the water, thereby forming a water layer 100 having a thickness of about 1 to 3 mm covering the front side 10a of the semiconductor wafer 10 held on the spinner table 711.

After performing the water layer forming step mentioned above, a first liquid resin dropping step is performed to drop a liquid resin onto the water layer 100 at the center of the front side 10a of the semiconductor wafer 10. The first liquid resin dropping step is performed in the following manner. The control means 8 operates the electric motor 752 of the water supplying mechanism 75 to retract the water nozzle 751 to the standby position. Thereafter, the control means 8 operates the electric motor 742 of the liquid resin supplying mechanism 74 to swivel the nozzle portion 741a of the liquid resin nozzle 741 about the axis of the support portion 741b so that the front end of the nozzle portion 741a comes to a position directly above the center of the front side 10a of the semiconductor wafer 10 held on the spinner table 711 as shown in FIG. 8. The control means 8 next operates the liquid resin supplying means 740 to drop a liquid resin 110 in a predetermined amount from the nozzle portion 741a of the liquid resin nozzle 741 onto the water layer 100 at the center of the front side 10a of the semiconductor wafer 10. In the case that the diameter of the semiconductor wafer 10 is 300 mm, the amount of the liquid resin 110 to be dropped is set to 1 cc. The liquid resin 110 is preferably selected from a water-soluble resin such as PVA (polyvinyl alcohol), PEG (polyethylene glycol), and PEO (polyethylene oxide).

Figure 9A:
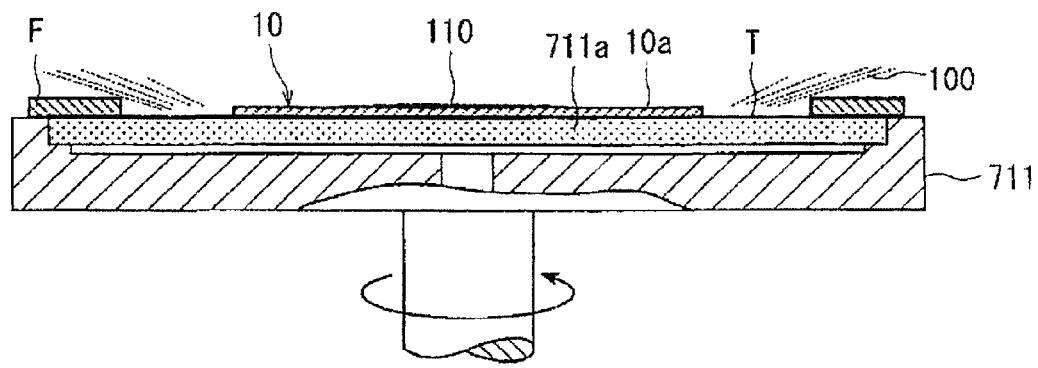
FIGS. 9A and 9B are sectional side views for illustrating a first resin film forming step in the protective film forming method according to the present invention.
Figure 9B:
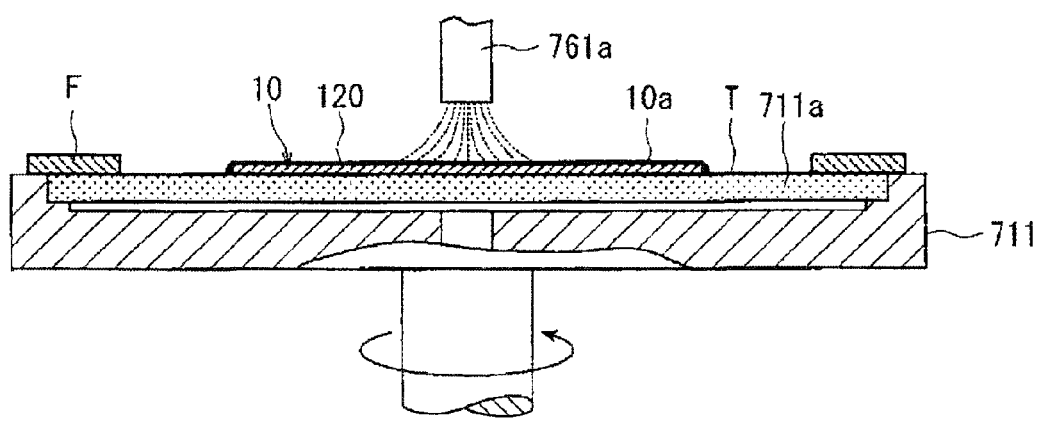

After performing the first liquid resin dropping step mentioned above, a first resin film forming step is performed in the following manner. The control means 8 operates the electric motor 712 of the spinner table mechanism 71 to rotate the spinner table 711, so that the semiconductor wafer 10 held on the spinner table 711 is rotated to scatter the water layer 100 by a centrifugal force, and the liquid resin 110 is radially spread over the front side 10a of the semiconductor wafer 10 as shown in FIG. 9A. As a result, a first resin film 120 is formed so as to fully cover the front side 10a of the semiconductor wafer 10 as shown in FIG. 9B. In the first resin film forming step, the control means 8 operates the electric motor 712 of the spinner table mechanism 71 to rotate the spinner table 711 in the direction shown by an arrow in FIG. 9B at 500 rpm for 10 seconds, thereby spin-drying the first resin film 120. At this time, the control means 8 preferably operates the electric motor 762 of the air supplying mechanism 76 to swivel the nozzle portion 761a of the air nozzle 761 about the axis of the support portion 761b so that the front end of the nozzle portion 761a comes to a position directly above the center of the front side 10a of the semiconductor wafer 10 held on the spinner table 711 as shown in FIG. 9B. The control means 8 next preferably operates the air supplying means 760 to supply air from the nozzle portion 761a of the air nozzle 761 onto the first resin film 120 formed on the front side 10a of the semiconductor wafer 10. At this time, the nozzle portion 761a of the air nozzle 761 is preferably swung in a required angular range. As described above, in the first resin film forming step, the spinner table 711 is rotated to thereby rotate the semiconductor wafer 10 held on the spinner table 711, thereby applying a centrifugal force to the water layer 100 and the liquid resin 110 on the front side 10a of the semiconductor wafer 10 to scatter the water layer 100 and to also radially spread the liquid resin 110 dropped on the water layer 100. As a result, the first resin film 120 is formed so as to fully cover the front side 10a of the semiconductor wafer 10. Accordingly, the first resin film 120 having a uniform thickness can be formed entirely on the front side 10a of the semiconductor wafer 10. In this preferred embodiment, the thickness of the first resin film 120 is about 0.1 μm.

After performing the first resin film forming step mentioned above, a second liquid resin dropping step is performed in the following manner. The control means 8 operates the electric motor 742 of the liquid resin supplying mechanism 74 to swivel the nozzle portion 741a of the liquid resin nozzle 741 about the axis of the support portion 741b so that the front end of the nozzle portion 741a comes to a position directly above the center of the front side 10a of the semiconductor wafer 10 held on the spinner table 711 as shown in FIG. 10. The control means 8 next operates the liquid resin supplying means 740 to drop the liquid resin 110 in a predetermined amount from the nozzle portion 741a of the liquid resin nozzle 741 onto the center of the first resin film 120 formed on the front side 10a of the semiconductor wafer 10. In the case that the diameter of the semiconductor wafer 10 is 300 mm, the amount of the liquid resin 110 to be dropped is set to 1 cc.

Figure 11A:
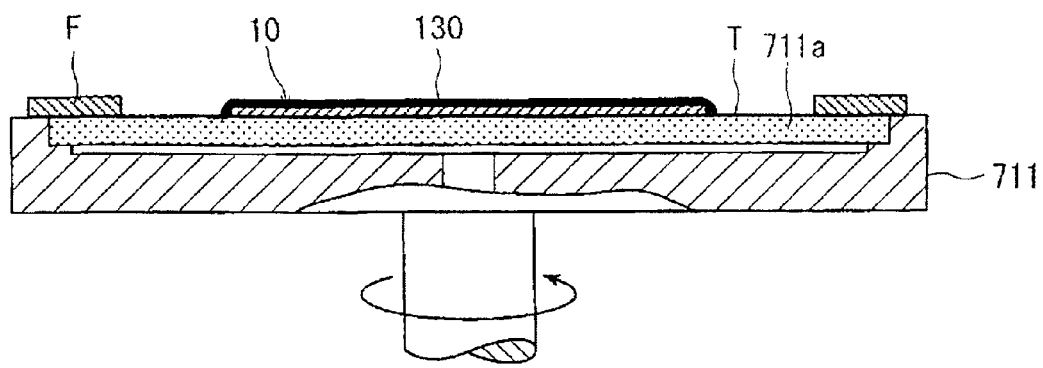
FIGS. 11A and 11B are sectional side views for illustrating a second resin film forming step in the protective film forming method according to the present invention.
Figure 11B:
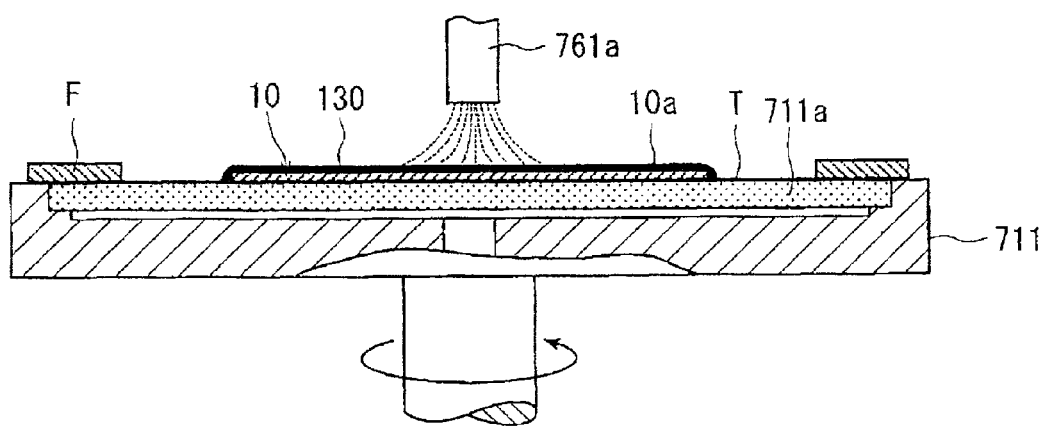

After performing the second liquid resin dropping step mentioned above, a second resin film forming step is performed in the following manner. The control means 8 operates the electric motor 712 of the spinner table mechanism 71 to rotate the spinner table 711, so that the semiconductor wafer 10 held on the spinner table 711 is rotated to radially spread over the first resin film 120 fully covering the front side 10a of the semiconductor wafer 10 by a centrifugal force as shown in FIG. 11A, thereby forming a second resin film 130 on the first resin film 120. In the second resin film forming step, the control means 8 operates the electric motor 712 of the spinner table mechanism 71 to rotate the spinner table 711 in the direction shown by an arrow in FIG. 11B at 500 rpm for 120 seconds, thereby spin-drying the second resin film 130. At this time, the control means 8 preferably operates the electric motor 762 of the air supplying mechanism 76 to swivel the nozzle portion 761a of the air nozzle 761 about the axis of the support portion 761b so that the front end of the nozzle portion 761a comes to a position directly above the center of the front side 10a of the semiconductor wafer 10 held on the spinner table 711 as shown in FIG. 11B. The control means 8 next preferably operates the air supplying means 760 to supply air from the nozzle portion 761a of the air nozzle 761 onto the second resin film 130 formed on the first resin film 120 covering the front side 10a of the semiconductor wafer 10. At this time, the nozzle portion 761a of the air nozzle 761 is preferably swung in a required angular range. As described above, in the second resin film forming step, the spinner table 711 is rotated to thereby rotate the semiconductor wafer 10 held on the spinner table 711, thereby applying a centrifugal force to the liquid resin 110 dropped on the first resin film 120. As a result, the liquid resin 110 is radially spread over the first resin film 120 having good affinity to the liquid resin 110, thus forming the second resin film 130 on the first resin film 120. Accordingly, the second resin film 130 having a uniform thickness can be formed entirely on the front side 10a of the semiconductor wafer 10. In this preferred embodiment, the thickness of the second resin film 130 is about 4 μm.

According to the protective film forming method in this preferred embodiment, 1 cc of liquid resin 110 is dropped in each of the first and second liquid resin dropping steps (the total amount of the liquid resin 110 is 2 cc), thereby forming a protective film composed of the first resin film 120 and the second resin film 130 having a total thickness of about 4 μm on the front side 10a of the semiconductor wafer 10 having a diameter of 300 mm. As compared with a conventional protective film forming method in the case that a protective film having a thickness of about 4 μm is formed on the front side of a wafer having a diameter of 300 mm, the amount of use of the liquid resin in the present invention can be reduced to 1/10 to 1/15, that is, greater economy can be achieved according to the present invention.

Figure 4:
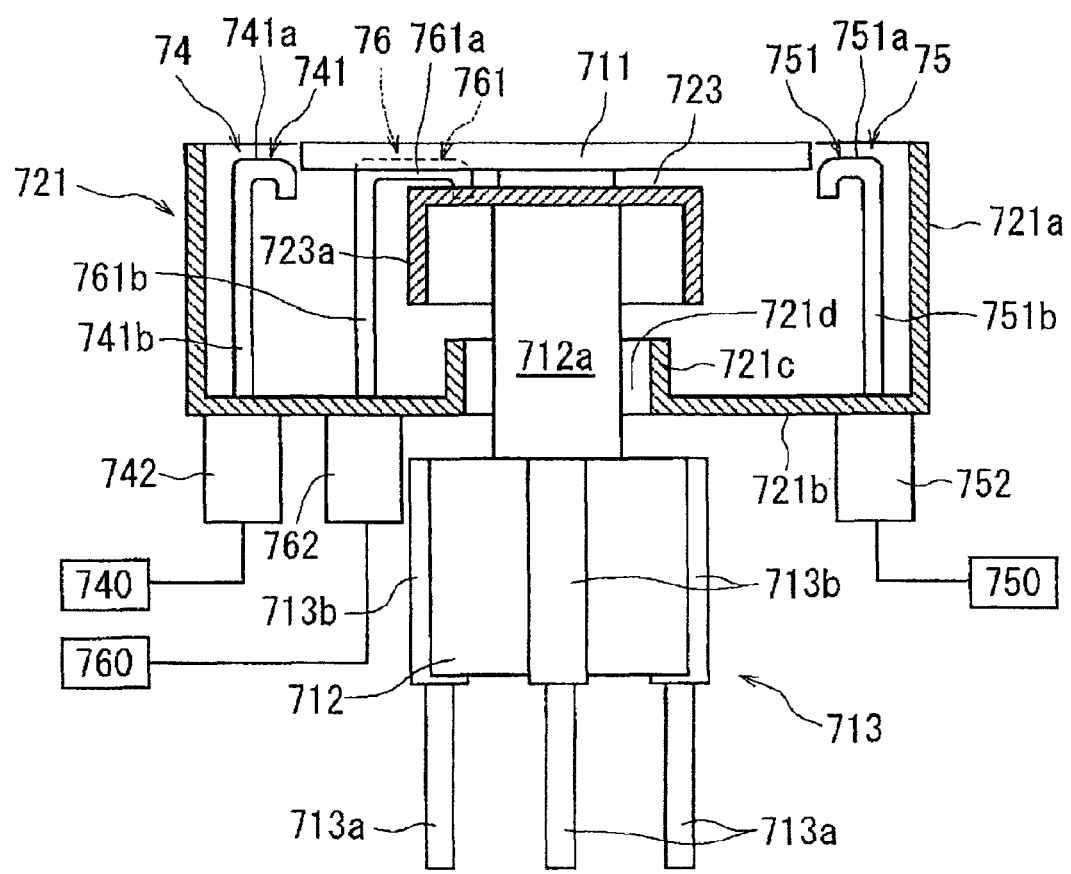
FIG. 4 is a sectional side view of the protective film forming apparatus serving also as cleaning means shown in FIG. 3 in the condition where a spinner table is set at a work load/unload position.

After performing the protective film forming step mentioned above, the spinner table 711 is lifted to the load/unload position shown in FIG. 4 and the suction holding of the semiconductor wafer 10 on the spinner table 711 is canceled. Next, the semiconductor wafer 10 is carried from the spinner table 711 to the vacuum chuck 32 of the chuck table 3 by the second carrying means 15. The semiconductor wafer 10 thus carried to the vacuum chuck 32 is held on the vacuum chuck 32 under suction. Next, the chuck table 3 holding the semiconductor wafer 10 is moved to a position directly below the imaging means 5 by the feeding means (not shown) mentioned above.

When the chuck table 3 is positioned directly below the imaging means 5 as mentioned above, the imaging means 5 and the control means (not shown) perform image processing such as pattern matching for aligning each street 101 extending in a first direction on the front side 10a of the semiconductor wafer 10 to the focusing means 42 of the laser beam applying means 4 for applying a laser beam along each street 101. Thus, the alignment of a laser beam applying position to each street 101 extending in the first direction is performed. Similarly, the alignment of a laser beam applying position to each street 101 extending in a second direction perpendicular to the first direction is also performed. In the case that the protective film formed on the front side 10a of the semiconductor wafer 10 is not transparent, infrared radiation for imaging may be applied to the front side 10a of the semiconductor wafer 10 to perform the alignment from the front side 10a.

Figure 12A:
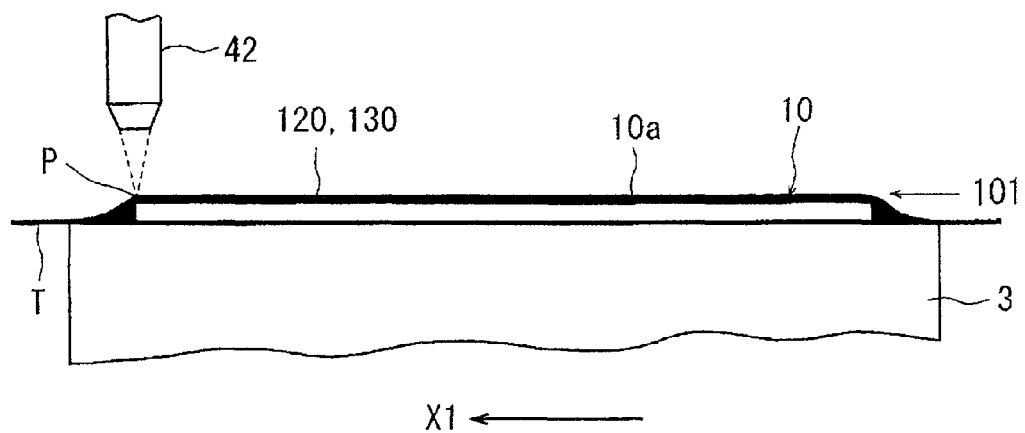
FIGS. 12A and 12B are sectional side views for illustrating a laser processing step using laser beam applying means in the laser processing system shown in FIG. 1.
Figure 12B:
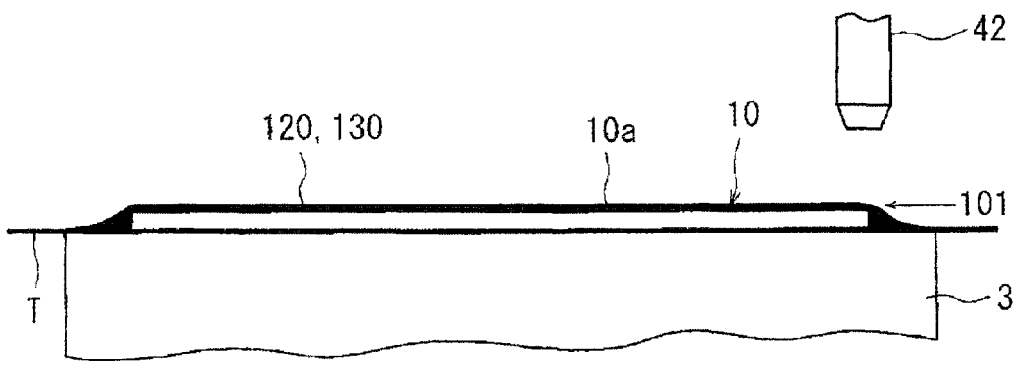

After performing the alignment of the laser beam applying position to detect all the streets 101 formed on the front side 10a of the semiconductor wafer 10 held on the chuck table 3 is moved to a laser beam applying region where the focusing means 42 of the laser beam applying means 4 is located, and a predetermined one of the streets 101 extending in the first direction is positioned directly below the focusing means 42. At this time, the semiconductor wafer 10 is set so that one end (left end as viewed in FIG. 12A) of this predetermined street 101 is positioned directly below the focusing means 42 as shown in FIG. 12A. Thereafter, a pulsed laser beam is applied from the focusing means 42 of the laser beam applying means 4 to the front side 10a of the semiconductor wafer 10 as moving the chuck table 3 holding the semiconductor wafer 10 in the direction shown by an arrow X1 in FIG. 12A at a predetermined feed speed (laser beam applying step). When the other end (right end as viewed in FIG. 12B) of the predetermined street 101 comes to a position directly below the focusing means 42 as shown in FIG. 12B, the application of the pulsed laser beam is stopped and the movement of the chuck table 3 is also stopped. As shown in FIG. 12A, the focal point P of the pulsed laser beam is set near the upper surface of the predetermined street 101.

Figure 13:
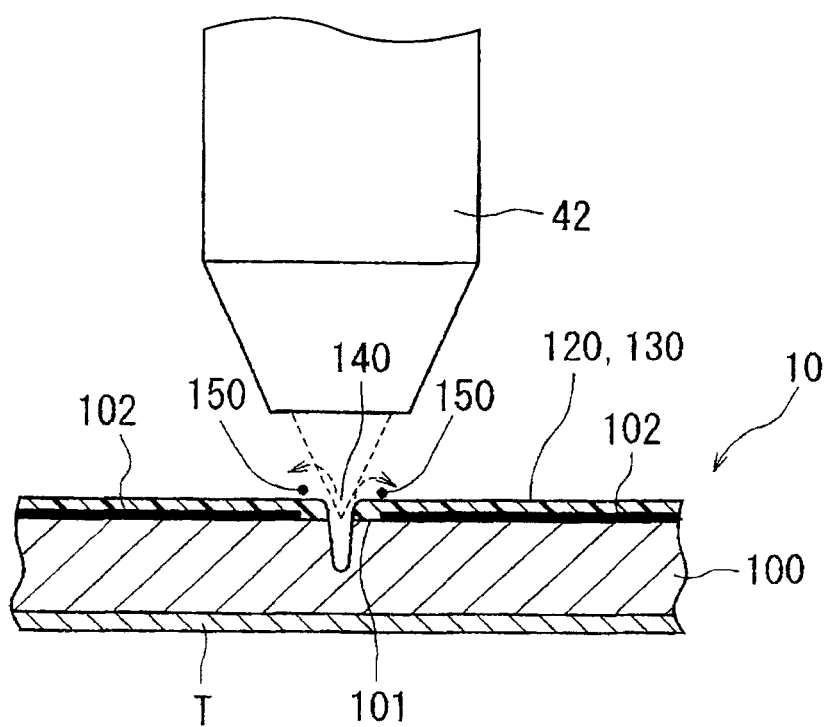
FIG. 13 is an enlarged sectional view of an essential part of the semiconductor wafer processed by the laser processing step shown in FIGS. 12A and 12B to form a laser processed groove.

By performing this laser beam applying step, a laser processed groove 140 is formed along the predetermined street 101 as shown in FIG. 13. At this time, even when debris 150 is generated by the application of the pulsed laser beam as shown in FIG. 13, the debris 150 is blocked by the protective film composed of the first resin film 120 and the second resin film 130, so that the debris 150 is prevented from sticking to the devices 102 and bonding pads (not shown). As described above, the protective film composed of the first resin film 120 and the second resin film 130 covering the front side 10a of the semiconductor wafer 10 has a substantially uniform thickness, so that the laser processed groove 140 can be stably formed in this laser beam applying step. This laser beam applying step is performed for all of the streets 101 formed on the front side 10a of the semiconductor wafer 10 to thereby form the laser processed groove 140 along each street 101.

For example, the laser beam applying step is performed under the following processing conditions.

Light source of laser beam: YVO4 laser or YAG laser
Wavelength: 355 nm
Repetition frequency: 50 kHz
Power: 4 W
Focused spot diameter: 9.2 μm
Work feed speed: 200 mm/sec After performing the laser beam applying step along all of the streets 101 of the semiconductor wafer 10, the chuck table 3 holding the semiconductor wafer 10 thereon is returned to the initial position shown in FIG. 1 and the suction holding of the semiconductor wafer 10 on the chuck table 3 is canceled. Thereafter, the semiconductor wafer 10 is carried from the chuck table 3 to the vacuum chuck 711a of the spinner table 711 of the protective film forming apparatus 7 serving also as cleaning means by the second carrying means 15. The semiconductor wafer 10 thus carried to the vacuum chuck 711a is held under suction. At this time, all of the liquid resin nozzle 741, the water nozzle 751, and the air nozzle 761 are set at their standby positions retracted from the spinner table 711 as shown in FIGS. 3 and 4.

Figure 5:
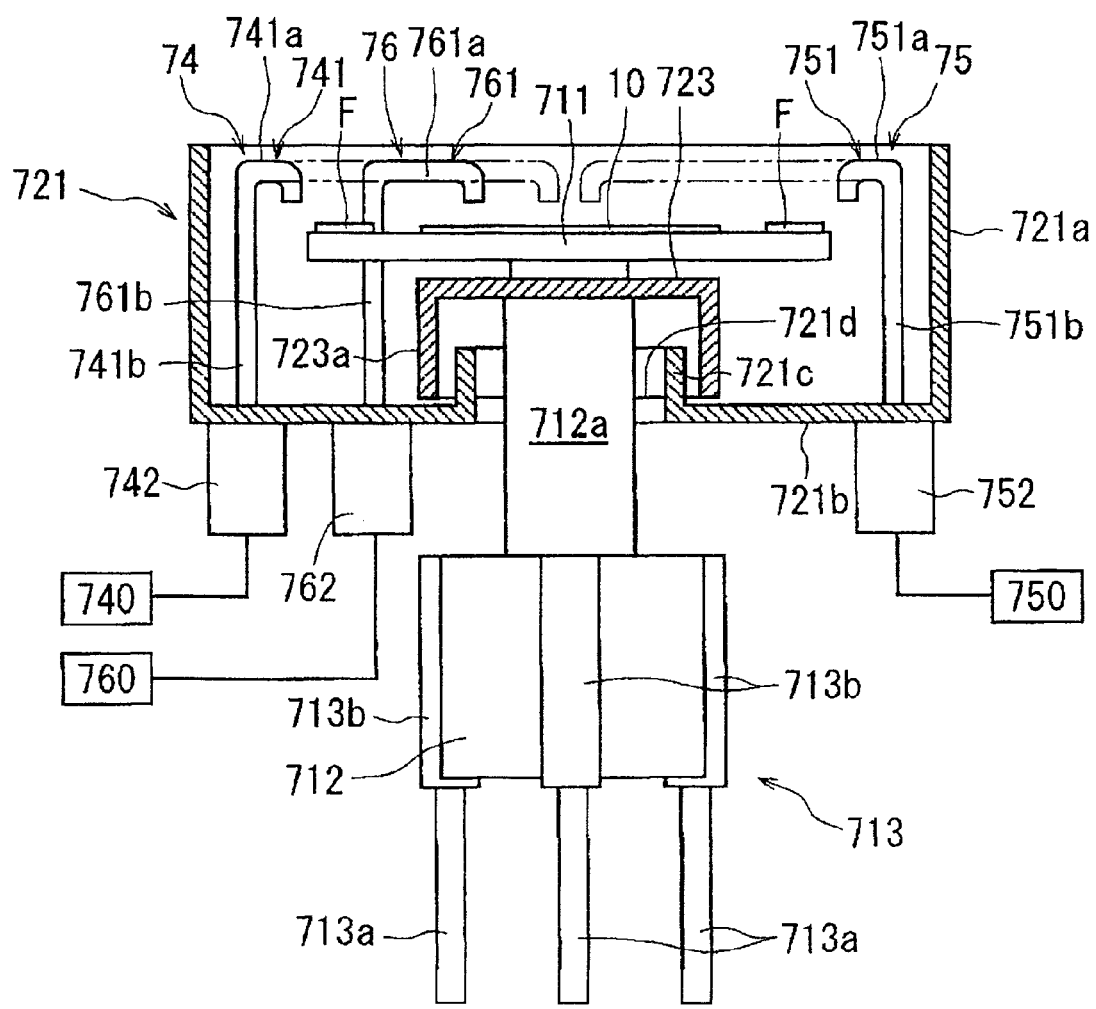
FIG. 5 is a view similar to FIG. 4, showing the condition that the spinner table is set at a working position.

In the condition where the semiconductor wafer 10 is held on the spinner table 711 of the protective film forming apparatus 7 serving also as cleaning means after processing, a cleaning step is performed in such a manner that the spinner table 711 is lowered to the working position shown in FIG. 5 and the electric motor 752 of the water supplying mechanism 75 is operated to move the front end of the nozzle portion 751a of the water nozzle 751 to the position directly above the center of the semiconductor wafer 10 held on the spinner table 711. Thereafter, the spinner table 711 is rotated at 800 rpm, for example, and the water supplying means 750 is operated to discharge a cleaning water from the front end of the nozzle portion 751a. The nozzle portion 751a is provided by a so-called two-fluid nozzle such that about 0.2 MPa of water and about 0.3 to 0.5 MPa of air are supplied and the water is sprayed by the pressure of the air to effectively clean the front side 10a of the semiconductor wafer 10 processed. At this time, the electric motor 752 is operated to swing the nozzle portion 751a of the water nozzle 751 in a required angular range from the center of the semiconductor wafer 10 to the outer circumference thereof. As a result, the protective film composed of the first resin film 120 and the second resin film 130 covering the front side 10a of the semiconductor wafer 10 can be easily cleaned off by the cleaning water because the protective film is formed of a water-soluble resin. At the same time, the debris 150 generated in the laser beam applying step is also removed with the protective film.

After performing the cleaning step mentioned above, a drying step is performed in such a manner that the water nozzle 751 is returned to the standby position and the spinner table 711 is rotated at 3000 rpm for about 15 seconds, for example. At this time, the electric motor 762 of the air supplying mechanism 76 is preferably operated to swing the nozzle portion 761a of the air nozzle 761 from the standby position so that the front end of the nozzle portion 761a comes to the position directly above the center of the front side 10a of the semiconductor wafer 10 held on the spinner table 711. Thereafter, the air supplying means 760 is preferably operated to discharge air from the front end of the nozzle portion 761a of the air nozzle 761. At this time, the nozzle portion 761a of the air nozzle 761 is preferably swung about the axis of the support portion 761b in a required angular range from the center of the semiconductor wafer 10 to the outer circumference thereof. As a result, the front side 10a of the semiconductor wafer 10 is dried.

After performing the drying step mentioned above, the rotation of the spinner table 711 is stopped and the air nozzle 761 of the air supplying mechanism 76 is returned to the standby position. Thereafter, the spinner table 711 is lifted to the load/unload position shown in FIG. 4 and the suction holding of the semiconductor wafer 10 on the spinner table 711 is canceled. Thereafter, the semiconductor wafer 10 is carried from the spinner table 711 to the positioning means 12 provided at the temporary setting portion 12a by the first carrying means 14. Finally, the semiconductor wafer 10 is carried from the positioning means 12 to the cassette 11 and inserted into the predetermined position of the cassette 11 by the work ejecting/inserting means 13.

While a specific preferred embodiment of the present invention has been described, the present invention is not limited to this preferred embodiment, but various modifications may be made within the scope of the present invention. For example, while the protective film forming apparatus 7 is incorporated in the laser processing system 1 in this preferred embodiment, the protective film forming apparatus 7 may be configured as an independent apparatus.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A protective film forming method for forming a protective film of resin on the front side of a wafer to be laser-processed, comprising:
   a wafer holding step of holding said wafer on a spinner table in the condition where the front side of said wafer is oriented upward;
   a water layer forming step of forming a water layer covering the front side of said wafer held on said spinner table, wherein the water layer formed during the water layer forming step has a thickness of between about 1 mm and about 3 mm;

a first liquid resin dropping step of dropping a liquid resin onto said water layer at the center of said wafer; and a first resin film forming step of rotating said spinner table to rotate said wafer held on said spinner table, thereby scattering said water layer and radially spreading said liquid resin dropped on said water layer to form a first resin film covering the front side of said wafer by a centrifugal force produced during rotation of said wafer.

2. A protective film forming method for forming a protective film of resin on the front side of a wafer to be laser-processed, comprising:

a wafer holding step of holding said wafer on a spinner table in the condition where the front side of said wafer is oriented upward;

a water layer forming step of forming a water layer covering the front side of said wafer held on said spinner table, wherein the water layer formed during the water layer forming step has a thickness of between about 1 mm and about 3 mm;

a first liquid resin dropping step of dropping a liquid resin onto said water layer at the center of said wafer; and a first resin film forming step of rotating said spinner table to rotate said wafer held on said spinner table, thereby scattering said water layer and radially spreading said liquid resin dropped on said water layer to form a first resin film covering the front side of said wafer by a centrifugal force produced during rotation of said wafer, wherein:

the back side of said wafer is attached to an adhesive tape supported to an annular frame; and said water layer forming step comprises a step of filling the area defined by the inner circumferential surface of said annular frame and said adhesive tape with water to an upper surface of the annular frame, thereby forming a water layer covering the front side of said wafer.

3. A protective film forming method for forming a protective film of resin on the front side of a wafer to be laser-processed, comprising:

a wafer holding step of holding said wafer on a spinner table in the condition where the front side of said wafer is oriented upward;

a water layer forming step of forming a water layer covering the front side of said wafer held on said spinner table, wherein the water layer formed during the water layer forming step has a thickness of between about 1 mm and about 3 mm;

a first liquid resin dropping step of dropping a liquid resin onto said water layer at the center of said wafer; and a first resin film forming step of rotating said spinner table to rotate said wafer held on said spinner table, thereby scattering said water layer and radially spreading said liquid resin dropped on said water layer to form a first resin film covering the front side of said wafer by a centrifugal force produced during rotation of said wafer, further comprising:

a second liquid resin dropping step of dropping said liquid resin onto said first resin film at the center of said wafer; and a second resin film forming step of rotating said spinner table to rotate said wafer held on said spinner table, thereby radially spreading said liquid resin dropped on said first resin film to form a second resin film covering said first resin film by a centrifugal force produced during rotation of said wafer.

\* \* \* \* \*